June 5, 1951 A. J. TORRE 2,555,520

CORE MOUNTING FOR PERMEABILITY TUNERS

Filed June 1, 1948

Inventor
ALTON JOHN TORRE

By Philip M. Cooper

Attorney

Patented June 5, 1951

2,555,520

UNITED STATES PATENT OFFICE 2,555,520

CORE MOUNTING FOR PERMEABILITY TUNERS

Alton John Torre, Westmont, N. J., assignor to Radio Corporation of America, a corporation of Delaware Application June 1, 1948, Serial No. 30,485

6 Claims. (Cl. 250—40)

This invention relates generally to permeability tuning systems, and particularly a multi-range permeability tuner including a paramagnetic core connected so as to minimize the capacitor losses of the tuner at high frequencies.

It is frequently desired to provide a broadcast receiver adapted to receive modulated waves within two or more different frequency ranges. Thus, for example, it is conventional practice to provide a broadcast receiver for the reception of both amplitude-modulated (AM) and frequency-modulated (FM) carrier waves. In that case, the two tuning ranges of the receiver are between approximately 500 to 1600 kilocycles (kc.) and 88 to 106 megacycles (mc.). It is also conventional practice to effect tuning of a receiver by moving a paramagnetic core relatively to a tuning inductance coil forming part of a resonant circuit thereby to vary the inductance of the coil. A paramagnetic material is defined as a material having a magnetic permeability greater than that of a vacuum, which is unity. The magnetic permeability of a paramagnetic material may be independent of the magnetizing force or it may vary with the magnetizing force, in which case the material is usually called ferromagnetic.

It is well known that distributed capacitance exists between a paramagnetic core and its coil. When the core is moved into and out of the coil for varying the resonant frequency of a circuit including the coil, the amount of capacitance between core and coil will vary. At high frequencies this distributed capacitance has an appreciable reactive impedance which is quite undesirable because its magnitude varies throughout the tuning range. Furthermore, the distributed capacitance causes capacitive losses across the coil which will increase the power factor of the resonant circuit and thus decrease the Q of the circuit. On the other hand, within a low frequency range the reactive impedance of this distributed capacitance becomes negligible. At such a low frequency range, however, it is desirable to maintain the core at a fixed potential such as ground potential. In most cases, the permeability tuner of a superheterodyne receiver comprises a signal frequency circuit and an oscillator tank circuit, each of which may be tuned by a separate core. In that case, the two cores should be electrically decoupled which may be effected by connecting both of them to the same fixed potential.

It is an object of the present invention, therefore, to connect a paramagnetic core arranged for tuning several tuning coils in succession, in such a manner that the undesirable distributed capacitance between the core and at least one of the coils is neutralized, thereby to reduce the capacitive losses across the coil.

Another object of the invention is to provide a permeability tuner including a high frequency tuning coil and a core for tuning the coil, the core being connected in such a manner as to minimize the capacitive losses across the coil.

A further object of the invention is to provide a multi-range permeability tuner of the type where a single paramagnetic core is movable to tune in succession two tuning coils and where the core is maintained at a fixed potential within a low frequency range and is allowed to have a floating radio-frequency potential within the high frequency range.

A conventional permeability tuning system may comprise a low frequency range tuning coil and a high frequency range tuning coil and a single core movable relatively to the coils for tuning them in succession. In accordance with the present invention there is provided a choke coil, such as a helically wound wire, for connecting the core to a fixed potential point such as ground to which the permeability tuning system is also connected. The choke has negligible impedance within the low frequency range and accordingly the core is effectively grounded at all frequencies within the low frequency range. For frequencies within the high frequency range the choke has an appreciable impedance and hence will permit the core to have a floating radio-frequency potential, that is, it may assume the high frequency potential of its associated coil. In this manner the capacitance existing between the core and the high frequency coil may be neutralized.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
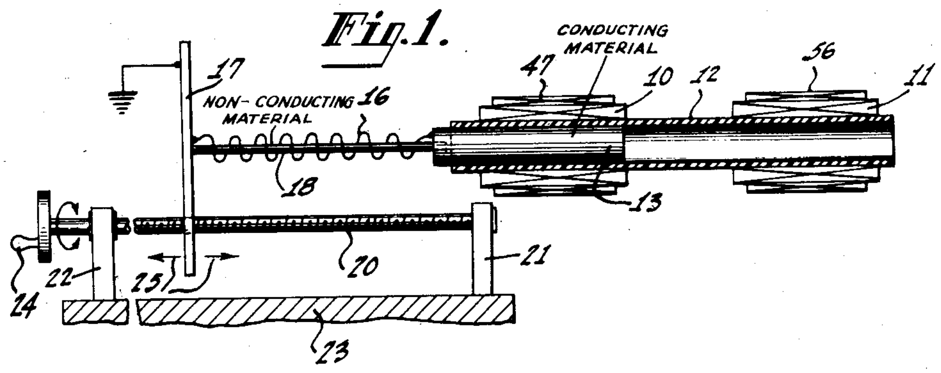
Fig. 1 is a schematic view, partly in section, of a permeability tuner embodying the present invention.

Referring now to Fig. 1 there is illustrated a permeability tuner comprising high frequency range inductance coil 10 and low frequency range inductance coil 11. As will be more fully explained in connection with Fig. 4, coils 10 and 11 form part of two separate resonant circuits tunable over different frequency ranges such as used in a superheterodyne receiver arranged for receiving both AM and FM waves. Coils 10 and 11 preferably are both wound on the same cylindrical coil form 12 which may be made of a suitable insulating material. Paramagnetic core 13 is axially movable within coil form 12 so as to tune coils 10 and 11 in succession. It is also feasible to use a diamagnetic core, that is, a core having a permeability smaller than unity, however the core 13 must in all cases be enough electrically conductive so that it may be effectively grounded, as will be hereinafter explained.

Figure 2:
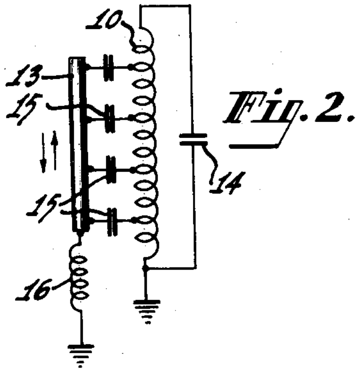
Fig. 2 is a schematic circuit diagram of the high frequency range tuning coil and the paramagnetic core grounded through a choke.

Referring now to Fig. 2, high frequency tuning coil 10 and core 13 are illustrated schematically. Coil 10 may be resonated by capacitor 14 and may have one terminal grounded as illustrated. Resonant circuit 10, 14 accordingly may be tuned over a predetermined high frequency tuning range by moving core 13 with respect to coil 10. As is well known, distributed capacitance, represented partially by capacitors 15, exists between core 13 and each turn of coil 10. The total effective distributed capacitance varies in magnitude with the movement of core 13 with respect to the coil. This capacitance is very undesirable because it increases the power factor of resonant circuit 10, 14 and hence decreases the Q of the circuit. The power factor of a resonant circuit is inversely proportioned to the Q of the circuit which may be defined as the energy stored by the circuit divided by the energy dissipated per cycle of the resonant frequency of the circuit. In accordance with the present invention this capacitance is isolated from ground by connecting an electrical choke 16 between core 13 and ground as shown in Fig. 2. This will permit core 13 to have a floating radio-frequency potential. Accordingly, the capacitive losses which appear across coil 10 are minimized.

As illustrated in Fig. 1, choke 16 may take the form of a tightly wound spiral electrically conductive wire having one end connected to core 13. The other end of choke 16 is connected to adjustable support 17 which is rigidly connected to core 13 by a non-conducting rod 18 which preferably consists of a non-magnetic material. Adjustable support 17 is grounded as indicated schematically. Accordingly, core 13 is connected to ground through a choke having an appreciable reactive impedance within a predetermined high frequency range.

In order to tune resonant circuit 10, 14, core 13 must be moved with respect to coil 10. A mechanism for moving core 13 has been shown for convenience schematically only and may comprise a threaded rod 20 which is threaded through movable support 17 and guided by bearings 21, 22. Bearings 21, 22 are secured to base plate 23. Threaded rod 20 may be rotated, for example, by handle 24, thereby to move support 17 in the direction of arrows 25. Movement of support 17 will cause a corresponding movement of core 13 through the intermediary of rod 18. Choke 16 will therefore not change its shape when core 13 is moved.

Figure 3:
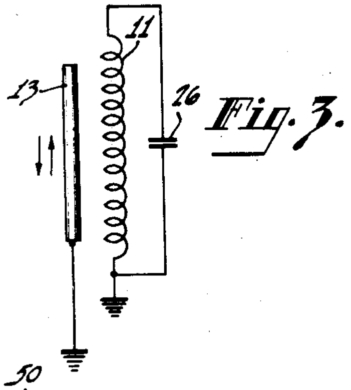
Fig. 3 is an equivalent circuit diagram for the low frequency range of the tuning coil where the core is effectively directly grounded.

Let it now be assumed that core 13 is moved towards the right of Fig. 1 into low frequency tuning coil 11. Referring now to Fig. 3, there is illustrated coil 11 and core 13. Capacitor 26 is connected across coil 11 to resonate it within a predetermined low frequency range. One terminal of coil 11 may be grounded as shown. It will now be assumed that within the low frequency range the distributed capacitance between coil 11 and core 13 may be neglected. In that case, it is no longer necessary to ground core 13 through a choke and preferably core 13 is directly grounded as illustrated. This may be effected by making the reactive impedance of choke 16 so small within the low frequency range that it may be disregarded. Accordingly, core 13 is effectively directly grounded for frequencies within the low frequency range to which resonant circuit 11, 26 may be tuned, while the core is isolated from ground by a choke for frequencies within the high frequency range to which resonant circuit 10, 14 may be tuned.

In a superheterodyne receiver, there is usually provided a tunable signal frequency circuit as well as a tunable oscillator tank circuit. Both circuits may be tuned by separate cores. When both cores are grounded they are thereby decoupled which is very desirable.

Figure 4:
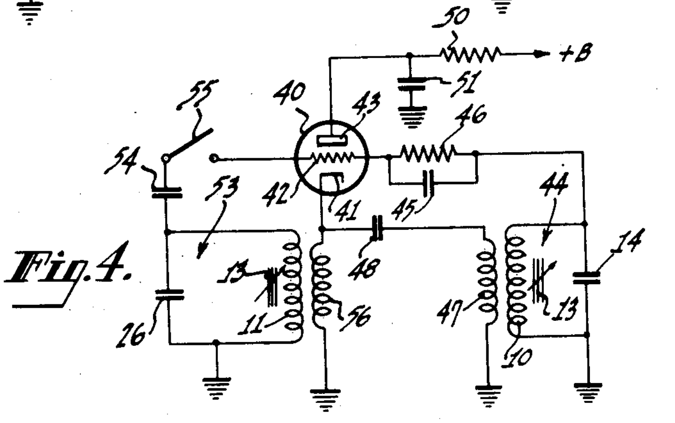
Fig. 4 is a circuit diagram of a multi-range oscillation generator in which the permeability tuner of the invention may be used with advantage.

Referring now to Fig. 4 there is illustrated a two range oscillator circuit of the general type disclosed and claimed in the copending application to Torre and Kirkwood, Serial No. 17,174, filed on March 26, 1948, and entitled "Frequency Converter and Oscillator Circuit." The oscillation generator of Fig. 4 is arranged to develop waves with two separate frequency ranges and comprises triode 40 including cathode 41, control grid 42 and anode 43. The oscillation generator further comprises oscillator tank circuit 44 including coil 10 and capacitor 14. Oscillator tank circuit 44 preferably is tunable within a high frequency range of approximately 98 to 118 mc., for receiving FM waves. Tank circuit 44 has one terminal grounded while its other terminal is coupled to control grid 42 through coupling condenser 45 bypassed by grid leak resistor 46. The high frequency oscillation generator further includes tickler coil 47 inductively coupled to coil 10 and connected between ground and cathode 41 through coupling condenser 48. Anode 43 is connected to a suitable source of voltage indicated at +B through dropping resistor 50. The junction point between dropping resistor and anode 43 is bypassed for alternating currents through bypass condenser 51.

The oscillation generator, as described so far, operates in a conventional manner. The grid circuit includes the oscillator tank circuit 44, and the required feedback to the cathode is provided through tickler coil 47. Coupling capacitor 48 preferably has a small reactance within the high frequency range to which tank circuit 44 may be tuned.

The oscillation generator may further be arranged to oscillate within a low frequency range between approximately 1 and 2 mc. for the reception of AM waves. For this purpose there is provided another oscillator tank circuit 53 consisting of coil 11 and capacitor 26. One terminal of tank circuit 53 is grounded while the other terminal may be selectively connected to control grid 42 through coupling capacitor 54 and switch 55. Another tickler coil 56 is connected between cathode 41 and ground and inductively coupled to coil 11.

When switch 55 is closed, the oscillation generator will oscillate at a frequency determined by tank circuit 53. Grid leak resistor 46 is grounded through a low impedance path including coil 10. Tuning coils 10 and 11 may be tuned by core 13 shown schematically adjacent to each coil, although in operation it will be understood that core 13 actually will be associated with only one coil at a time, depending upon the frequency to be received. As illustrated in Fig. 1, tickler coils 47 and 56 may be wound over high frequency range coil 10 and low frequency range coil 11, respectively. It is to be understood, however, that the permeability tuner of the invention as illustrated in Fig. 1 may also be used with other circuits, the oscillation generator of Fig. 4 being shown by way of example only.

There has thus been described a multi-range permeability tuner having a single core for tuning coils and where the core may be directly grounded within a low frequency range and grounded through a choke within a high frequency range to neutralize the distributed capacitance between the core and its associated coil. Thus, the capacitive losses across the coil are minimized, the power factor reduced and the Q improved.

What is claimed is:

1. In a permeability tuning system having a fixed potential connection, a high frequency range tuning coil, an electrically conductive core movable relatively to said coil for tuning it, and means providing a direct-current path including an unbypassed choke for connecting said core to said fixed potential connection, thereby to isolate the capacitance existing between said coil and said core, by raising the radio frequency potential of said core above ground potential at frequencies within said high frequency range.

2. In a permeability tuning system having a fixed potential connection, a low frequency range tuning coil, a high frequency range tuning coil, an electrically conductive core movable relatively to said coils for tuning said coils in succession, and means providing a direct-current path including an unbypassed choke for connecting said core to said fixed potential connection, said choke having negligible impedance within said low frequency range, and high impedance within said high frequency range.

3. In an electrical tuning system, a first resonant circuit tunable over a high frequency range and including a first inductance element, a second resonant circuit tunable over a low frequency range and including a second inductance element, a core movable for tuning said inductance elements in succession, and a high frequency choke connected electrically between said core and a point of fixed potential with respect to said circuits, said choke having negligible impedance within said low frequency range, and a high impedance within said high frequency range, thereby to essentially isolate the capacitance existing between said core and said first inductance element within said high frequency range only.

4. In a multi-range permeability tuning system, a first resonant circuit tunable over a high frequency range and including a first inductance element, a second resonant circuit tunable over a low frequency range and including a second inductance element, each of said circuits including a low impedance ground connection, a core movable for tuning said inductance elements in succession, and a wire helically wound in a fixed position with respect to said core connected electrically between said core and said ground connection, said wire having negligible impedance within said low frequency range and functioning as an electrical choke within said high frequency range, thereby to isolate the capacitance existing between said core and said first inductance element within said high frequency range only.

5. In an unbypassed permeability tuning system, a core movable to tune a plurality of tuning inductance elements for low and high frequency ranges in succession, and a choke coil conductively connecting said core to a point of fixed potential with respect to said system and electrically floating said core at frequencies above said low frequency range, said choke coil having negligible impedance within said low frequency range and high impedance within said high frequency range.

6. In a permeability tuning system, a core movable to tune a plurality of tuning inductance elements for low and high frequency range in succession, said core having secured thereto in a fixed position relative and movable therewith a helically wound wire for connecting said core to a point of fixed potential with respect to said elements, said wire functioning as an electrical choke within said high frequency range to isolate the capacitance existing between said core and said tuning inductance elements within said high frequency range only.

ALTON JOHN TORRE.

REFERENCES CITED

The following references are of record in the file of this patent:

UNITED STATES PATENTS

| Number | Name | Date |
|---|---|---|
| 1,850,914 | Bodoh et al. | Mar. 22, 1932 |
| 2,106,226 | Schaper | Jan. 25, 1938 |
| 2,137,435 | Yolles | Nov. 22, 1938 |
| 2,320,483 | Stocker | June 1, 1943 |

FOREIGN PATENTS

| Number | Country | Date |
|---|---|---|
| 382,076 | Great Britain | Oct. 22, 1932 |
| 447,104 | Great Britain | May 12, 1936 |